(12) United States Patent
Chen et al.

(10) Patent No.: US 8,441,306 B2
(45) Date of Patent: May 14, 2013

(54) POLY FUSE BURNING SYSTEM

(75) Inventors: Jui-Lung Chen, Hsinchu (TW);
Tien-Hui Huang, Kaohsiung (TW);
Chieh-Yao Chuang, Kaohsiung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 198 days.

(21) Appl. No.: 13/047,567

(22) Filed: Mar. 14, 2011

(65) Prior Publication Data

US 2012/0081826 A1    Apr. 5, 2012

(30) Foreign Application Priority Data

Oct. 1, 2010   (TW) ................. 99133485 A

(51) Int. Cl.
*H01H 37/76* (2006.01)
*H01H 85/00* (2006.01)

(52) U.S. Cl.
USPC ........................................ 327/525

(58) Field of Classification Search ......... 327/525, 327/526; 365/225.7
See application file for complete search history.

(56) References Cited

U.S. PATENT DOCUMENTS

| 5,896,059 | A * | 4/1999 | Durham et al. | 327/525 |
| 6,731,005 | B2 * | 5/2004 | Koyama et al. | 257/758 |
| 7,009,443 | B2 * | 3/2006 | Illegems | 327/525 |

* cited by examiner

*Primary Examiner* — Quan Tra
(74) *Attorney, Agent, or Firm* — McClure, Qualey & Rodack, LLP

(57) ABSTRACT

This invention provides a poly fuse burning system comprising a poly fuse, a controllable power source supplying power for burning the poly fuse, and a monitor circuit monitoring the burning state of the poly fuse, wherein when a targeted burning state is reached, a control signal is output to shut down the controllable power source to stop the burning.

6 Claims, 3 Drawing Sheets

POLY FUSE BURNING SYSTEM

CROSS REFERENCE TO RELATED APPLICATIONS

This Application claims priority of Taiwan Patent Application No. 99133485, filed on Oct. 1, 2010, the entirety of which is incorporated by reference herein.

BACKGROUND OF THE INVENTION

1. Field of the Invention

The present invention relates to a poly fuse burning system, and in particular relates to a poly fuse burning system capable of monitoring the burning state of the poly fuse.

2. Description of the Related Art

In computing, eFUSE is a technology which allows for the dynamic real-time reprogramming of computer chips. Speaking abstractly, computer logic is generally 'etched' or 'hard-coded' onto a chip and cannot be changed after the chip has finished being manufactured. By utilizing the eFUSE technology, a chip manufacturer can allow for the circuits on a chip to change while it is in operation. The eFUSE technology tunes performance or power consumption of a chip by burning out some convenient and ordinary poly fuses. If certain sub-systems fail, take too long to respond, or are consuming too much power, a chip can instantly change its behavior by burning poly fuses.

FIG. 1 is a diagram showing a conventional poly fuse burning system. As shown in FIG. 1, in the conventional poly fuse burning method, a voltage source which outputs a high voltage is mainly used to burn a poly fuse during a predetermined time interval. FIG. 1 shows a poly fuse burning system 10 comprising a poly fuse 12, a voltage source 14, a programmed pulse controller 16, and a switch M.

The voltage source 14 provides a high and fixed voltage level to burn the poly fuse 12. When the programmed pulse controller 16 turns on the switch M, a burning current flows through the poly fuse 12 for burning; when the programmed pulse controller 16 turns off the switch M, the burning current stop flowing through the poly fuse 12 to stop the burning. Namely, the programmed pulse controller 16 is used to control a pulse width for burning the poly fuse 12.

However, for the above poly fuse burning method, there is a problem with tuning of the pulse width. If the pulse width is too wide (that is, the pulse width is wider than a pulse width just capable of burning out the poly fuse), some metal materials may melt and then flow to the hole produced by the destroyed poly fuse because of overheat, causing the resistance across the poly fuse to fall suddenly, which would lead to an undesired state. If the pulse width is too narrow (that is, the pulse width is narrower than a pulse width just capable of burning out the poly fuse), a number of inspections for checking whether the poly fuse is burnt out is necessary, and the pulse may be provided many times until the poly fuse is burnt out.

In the burning method described above, the pulse width which is enough to burn out each poly fuse poly may be different for many kinds of poly fuses. Therefore, manufacturer's need to spend time on testing which pulse width is appropriate to burn out a kind of poly fuse.

Meanwhile, the voltage source can also provide a gradually rising voltage level to burn the poly fuse. FIG. 2 is a voltage-current curve diagram of when a poly fuse is being burnt. As shown in FIG. 2, when the voltage applied by the voltage source stays within a range from 0V to 3V, the poly fuse is not yet been burnt out, and the current flowing through the poly fuse is roughly proportional to the voltage applied by the voltage source. Meanwhile, when the voltage applied by the voltage source surpasses 3V, the poly fuse burns out, and the current flowing through the poly fuse falls suddenly because the resistance across the poly fuse rises substantially. In an ideal case, the poly fuse is burnt out, so the current value can remain at an extremely low value after the voltage applied by the voltage source surpasses 3V. However, as shown in FIG. 2, when the voltage source continues to raise the output voltage, the current value will rise several times. That is, an undesired state, as mentioned above, which is caused by some metal materials melting and flowing to the hole produced by the destroyed poly fuse for overheat when the voltage level applied by the voltage source is too high or the burning duration is too long.

As described above, in the conventional poly fuse burning method, whether controlling the pulse width (or burning duration) or the voltage level, control of continuing or stopping of the burning of the poly fuse according to the burning state of the poly fuse can not be instantaneously controlled. Also, it is difficult to adjust the pulse width or the voltage level for various kinds of poly fuses. Furthermore, the resistance of the poly fuse may become low through time, so the conventional poly fuse burning method which controls the duration or the voltage level to burn the poly fuse can only determine whether the poly fuse is burnt out or not. However, the burning degree of the poly fuse is unable to be precisely controlled.

BRIEF SUMMARY OF THE INVENTION

A detailed description is given in the following embodiments with reference to the accompanying drawings.

To solve the above problem in the conventional poly fuse burning method, the invention provides a poly fuse burning system, comprising: a poly fuse; a controllable power source supplying power for burning the poly fuse; and a monitor circuit monitoring the burning state of the poly fuse, wherein when a targeted burning state is reached, a control signal is output to shut down the controllable power source to stop the burning.

In the poly fuse burning system of the invention, the controllable power source supplies power for burning the poly fuse by outputting different voltage levels.

In the poly fuse burning system of the invention, the controllable power source outputs a gradually rising voltage level or a fixed voltage level.

In the poly fuse burning system of the invention, the monitor circuit monitors the voltage across the poly fuse to determine whether the poly fuse has reached the targeted burning state.

In the poly fuse burning system of the invention, the monitor circuit monitors the current flowing through the poly fuse to determine whether the poly fuse has reached the targeted burning state.

In the poly fuse burning system of the invention, the monitor circuit comprises: a current mirror circuit copying the current flowing through the poly fuse with a predetermined ratio; and a programmable current detection circuit receiving the current copied by the current mirror circuit, comparing the current copied by the current mirror circuit with a reference current, and shutting down the controllable power source in accordance with the comparison result.

In the poly fuse burning system of the invention, the controllable power source outputs a voltage level to burn the poly fuse, and the programmable current detection circuit adjusts the voltage level in accordance with the current provided by the current mirror circuit.

In the poly fuse burning system of the invention, the poly fuse consists of a plurality of material layers, wherein a plurality of burning states of the poly fuse corresponding to different resistances are reached by selectively burning out one or more of the plurality of material layers of the poly fuse.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
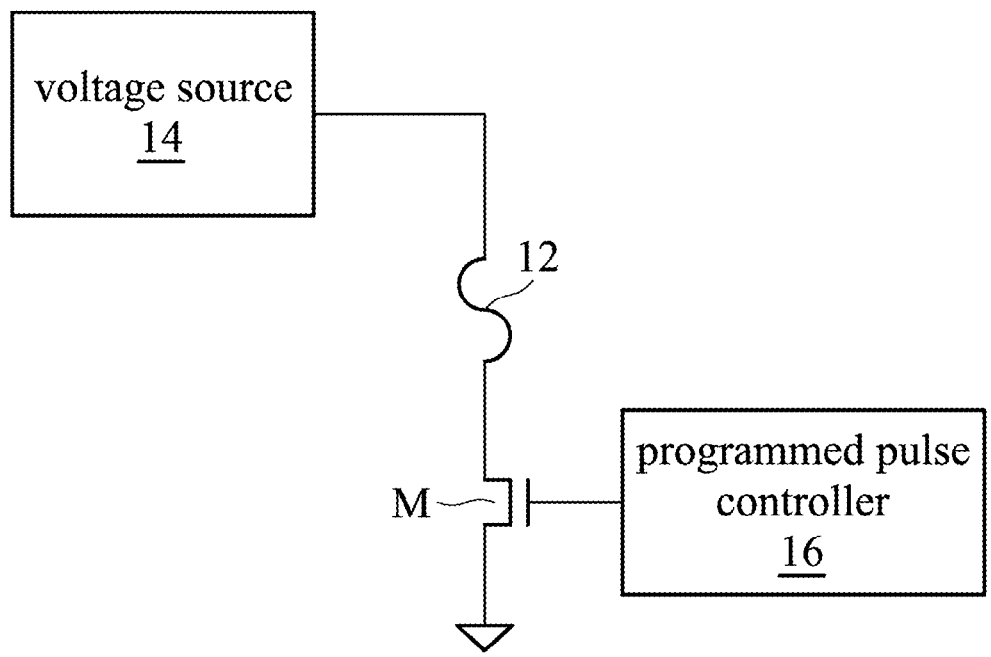
FIG. 1 is a diagram showing a conventional poly fuse burning system.
Figure 2:
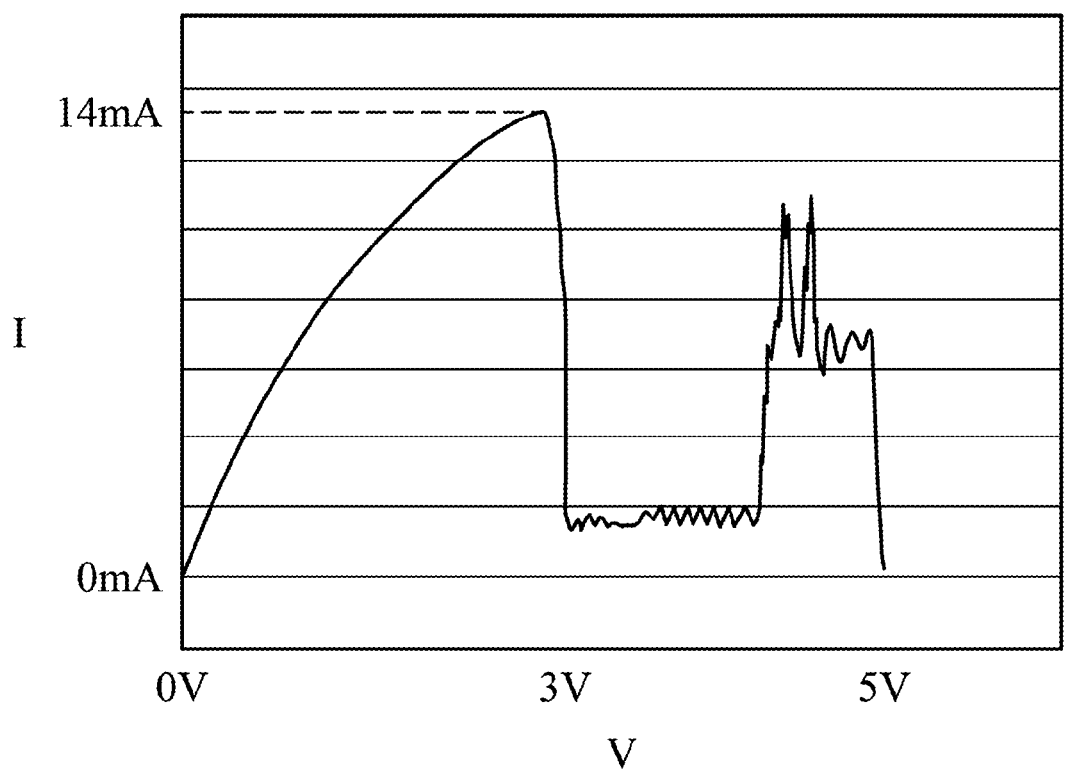
FIG. 2 is a voltage-current curve diagram of when a poly fuse is being burnt.
Figure 3:
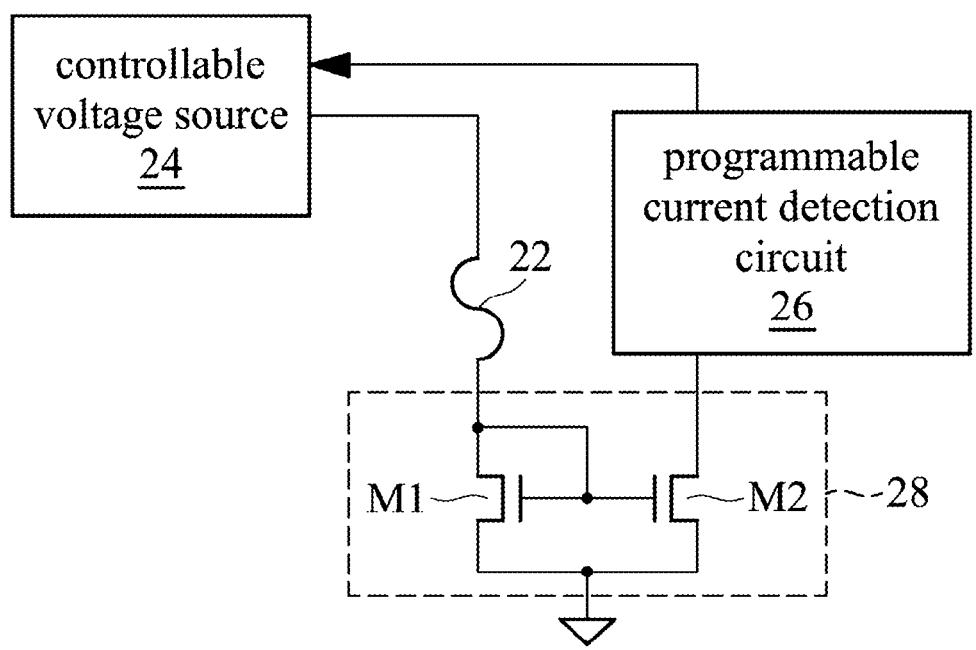
FIG. 3 is a diagram showing a poly fuse burning system according to the invention.

FIG. 3 is a diagram showing a poly fuse burning system according to the invention. As shown in FIG. 3, the invention provides a poly fuse burning system 20 comprising a poly fuse 22, a controllable voltage source 24, a programmable current detection circuit 26, and a current mirror circuit 28.

The controllable voltage source 24 can output different voltage levels to provide power for burning the poly fuse 22. The voltage level can be controlled as a gradually rising voltage level or a fixed voltage level. The controllable voltage source 24 is shut down when the poly fuse burning system 20 determines that the poly fuse 22 has reached a targeted burning state.

The current mirror circuit 28, comprising a transistor M1 and a transistor M2, receives the current flowing through the poly fuse 22, and lets the current flow through the transistor M1. Then the current mirror circuit 28 utilizes the unsymmetrical relationship between the transistor M1 and the transistor M2 to copy the current flowing through the transistor M1 with a predetermined ratio, and then let the copied current flow through the transistor M2.

The programmable current detection circuit 26 receives the current flowing through the transistor M2 and compares the value of the current coming from the current mirror circuit 28 and the value of a reference current provided by an external circuit. The value of the reference current corresponds to the value of the current flowing through the transistor M2 when the poly fuse 22 reaches the targeted burning state. When the value of the current coming from the current mirror circuit 28 is lower than the value of the reference value, the programmable current detection circuit 26 outputs a control signal to instantly shut down the controllable voltage source 24.

The programmable current detection circuit 26 can further be programmed so that when the voltage level output from the controllable voltage source 24 is too low, which causes an increase in the duration of the burning, the programmable current detection circuit 26 will output a control signal to raise the voltage level output from the controllable voltage source 24 in accordance with the value of the current coming the current mirror circuit 28.

Therefore, the poly fuse burning system of the invention can monitor the burning state of the poly fuse in real time, and burn the poly fuse with an appropriate power and burning duration. As a result, the reliability of the poly fuse is raised. Furthermore, for a poly fuse consisting of a number of material layers, as one material layer burns out, the resistance across the poly fuse changes by several orders of magnitude. The characteristic, wherein the poly fuse burning system monitors the burning state of the poly fuse in real time, is useful for controlling the burning degree of the poly fuse and burning the poly fuse to a plurality of burning states corresponding to different resistances.

The poly fuse burning system of the invention is applicable for eFuse technology for a system-on-chip, drivers for small LCD, OLED, or CSTN panels, or the like.

While the invention has been described by way of example and in terms of the preferred embodiment, it is to be understood that the invention is not limited to the disclosed embodiment. For example, although the above embodiment shows that the poly fuse burning system determines the burning state of the poly fuse by monitoring a current flow, it is also possible that the poly fuse burning system determines the burning state of the poly fuse by monitoring the voltage across the poly fuse. Therefore, the scope of the appended claims should be accorded the broadest interpretation so as to encompass all such modifications and similar arrangements.

What is claimed is:

1. A poly fuse burning system, comprising:
a poly fuse;
a controllable power source supplying power for burning the poly fuse; and
a monitor circuit monitoring the burning state of the poly fuse, wherein when a targeted burning state is reached, the monitor circuit outputs a control signal to shut down the controllable power source to stop the burning, and
wherein the monitor circuit comprises:
a current mirror circuit copying the current flowing through the poly fuse with a predetermined ratio; and
a programmable current detection circuit receiving the current copied by the current mirror circuit, comparing the current copied by the current mirror circuit with a reference current, and shutting down the controllable power source in accordance with the comparison result.

2. The poly fuse burning system as claimed in claim 1, wherein the controllable power source supplies power for burning the poly fuse by outputting different voltage levels.

3. The poly fuse burning system as claimed in claim 1, wherein the controllable power source outputs a gradually rising voltage level or a fixed voltage level.

4. The poly fuse burning system as claimed in claim 1, wherein the monitor circuit monitors the current flowing through the poly fuse to determine whether the poly fuse has reached the targeted burning state.

5. The poly fuse burning system as claimed in claim 1, wherein the controllable power source outputs a voltage level to burn the poly fuse, and the programmable current detection circuit adjusts the voltage level in accordance with the current provided by the current mirror circuit.

6. The poly fuse burning system as claimed in claim 1, wherein the poly fuse consists of a plurality of material layers, and a plurality of burning states of the poly fuse corresponding to different resistances are reached by selectively burning out one or more of the plurality of material layers of the poly fuse.

* * * * *